United States Patent
Wang et al.

(10) Patent No.: US 7,256,094 B2
(45) Date of Patent: Aug. 14, 2007

(54) METHOD FOR CHANGING THRESHOLD VOLTAGE OF DEVICE IN RESIST ASHER

(75) Inventors: Chungdar Daniel Wang, Colorado Springs, CO (US); William Markland, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 122 days.

(21) Appl. No.: 11/136,131

(22) Filed: May 24, 2005

(65) Prior Publication Data

US 2006/0270172 A1    Nov. 30, 2006

(51) Int. Cl.
 *H01L 21/336*    (2006.01)
(52) U.S. Cl. .............. 438/301; 438/689; 257/E21.703; 257/E21.122
(58) Field of Classification Search ............... 438/301, 438/689; 134/1.3
 See application file for complete search history.

(56) References Cited

U.S. PATENT DOCUMENTS

| | | | |
|---|---|---|---|
| 4,578,128 A | 3/1986 | Mundt et al. ............... | 148/191 |
| 5,989,963 A * | 11/1999 | Luning et al. ............... | 438/289 |
| 6,015,740 A * | 1/2000 | Milic-Strkalj ............... | 438/300 |
| 6,420,279 B1 * | 7/2002 | Ono et al. .................. | 438/785 |
| 6,426,302 B2 * | 7/2002 | Kitagawa ..................... | 438/710 |
| 6,440,864 B1 * | 8/2002 | Kropewnicki et al. ...... | 438/710 |
| 6,517,738 B1 * | 2/2003 | Torek et al. ................ | 252/79.1 |
| 6,524,936 B2 | 2/2003 | Hallock et al. ............. | 438/531 |

(Continued)

FOREIGN PATENT DOCUMENTS

EP    1054433 A1 *    11/2000

OTHER PUBLICATIONS

S. Fujimura et al., "Additive Nitrogen Effects on Oxygen Plasma Downstream Ashing", Japanese Journal of Applied Physics, vol. 29, No. 10, Oct. 1990, pp. 2165-2170.

(Continued)

*Primary Examiner*—Walter Lindsay, Jr.
*Assistant Examiner*—Thu-Huong Dinh
(74) *Attorney, Agent, or Firm*—Schneck & Schneck; Thomas Schneck

(57) ABSTRACT

A method for forming a dopant in a substrate, by accumulating at least one dopant species in an asher chamber and forming the accumulated dopant species on an exposed portion of the substrate. A target concentration for the plasma chamber dopant species is determined by test or measurement. The asher is used to form the dopant species on the substrate, and the dopant species is driven into the substrate. A threshold voltage is measured on the substrate to verify or confirm that a proper dopant level has been achieved.

29 Claims, 5 Drawing Sheets

U.S. PATENT DOCUMENTS

| | | | |
|---|---|---|---|
| 6,893,907 B2* | 5/2005 | Maydan et al. | 438/149 |
| 6,939,434 B2* | 9/2005 | Collins et al. | 156/345.35 |
| 6,951,823 B2* | 10/2005 | Waldfried et al. | 438/710 |
| 6,967,154 B2* | 11/2005 | Meng et al. | 438/622 |
| 7,094,670 B2* | 8/2006 | Collins et al. | 438/513 |
| 2002/0048731 A1* | 4/2002 | Mullee | 430/329 |
| 2002/0151156 A1* | 10/2002 | Hallock et al. | 438/531 |
| 2005/0136604 A1* | 6/2005 | Al-Bayati et al. | 438/301 |
| 2006/0017138 A1* | 1/2006 | Ting | 257/632 |
| 2007/0072422 A1* | 3/2007 | Yeh | 438/689 |

OTHER PUBLICATIONS

L. Kassel et al., "Chamber Contamination in Ashing Processes of Ion Implanted Photoresist", S.P.I.E., vol. 1803, 1992, 0-8194-1001-2/93, pp. 89-96.

J.R. Hu et al., "Resist Shipping for Multilevel Interconnect Integrating Low k Dielectric Material", AVS First Int'l Conference on Microelectronics and Interfaces, Feb. 2000, 4 pages.

Compilation tables of inorganic compounds: Handbook of Chemistry and Physics, 69$^{th}$ Edition, CRC Press, p. D-192 thru D.

* cited by examiner

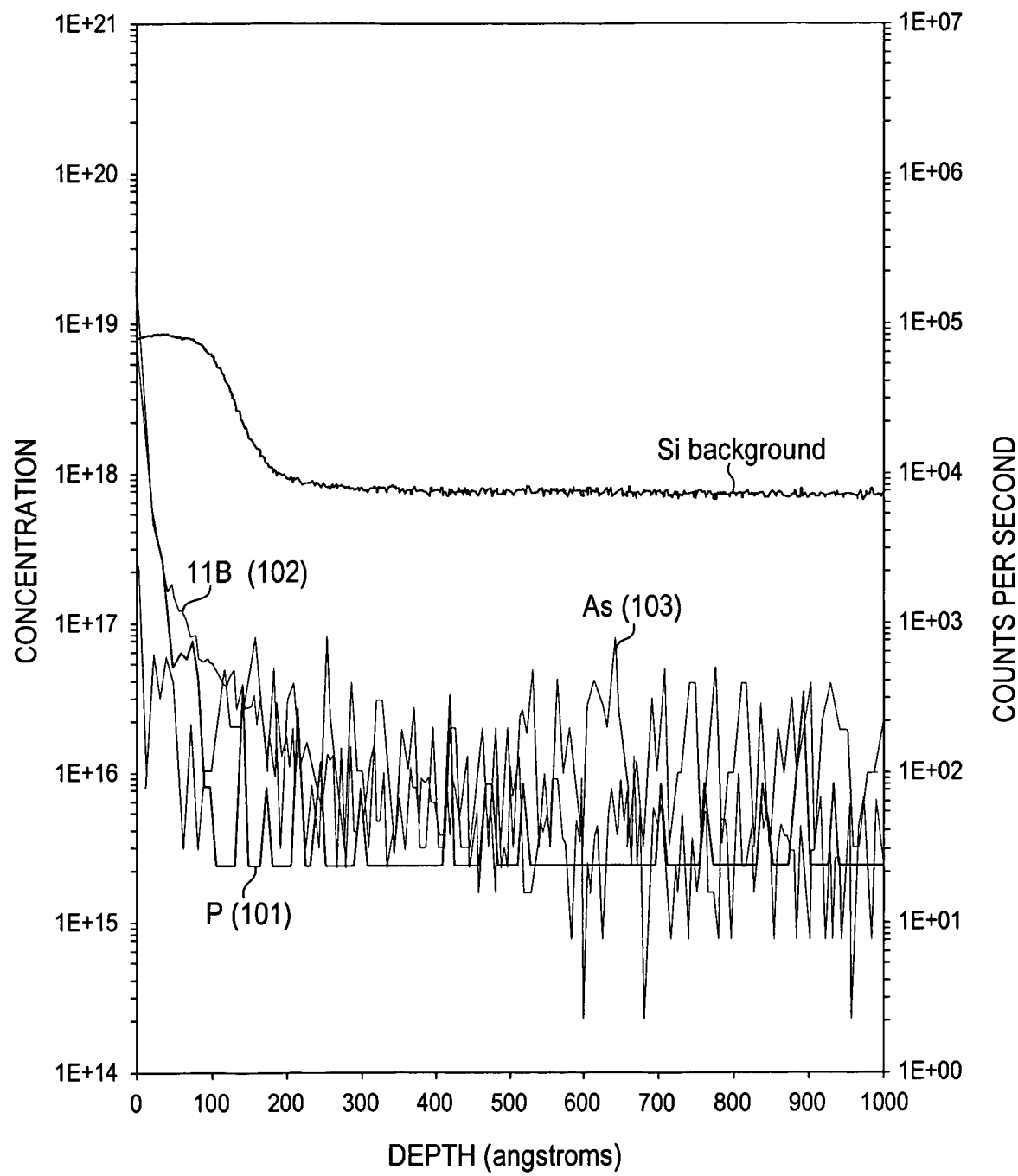
Fig._1B

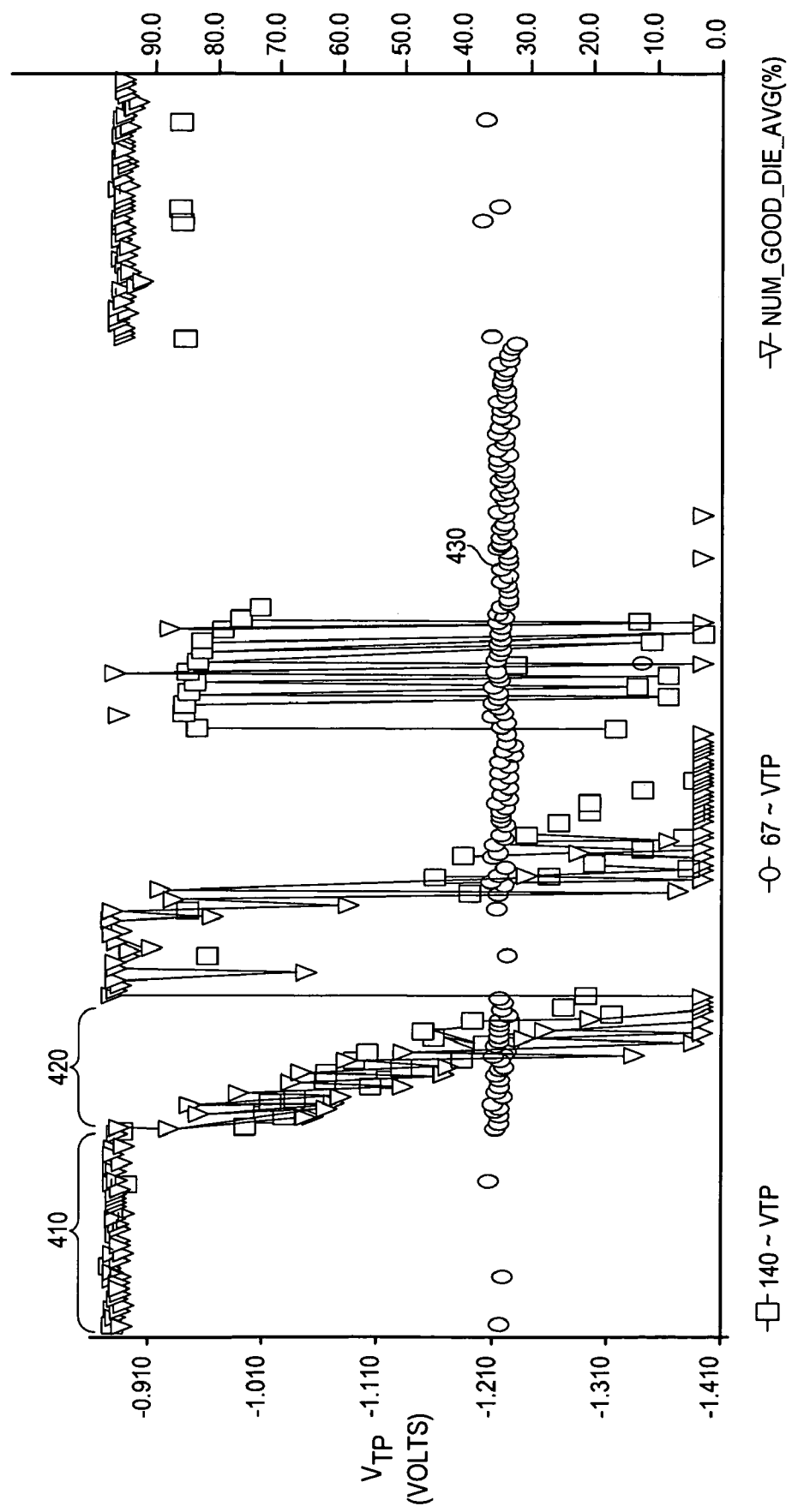
Fig._4

METHOD FOR CHANGING THRESHOLD VOLTAGE OF DEVICE IN RESIST ASHER

TECHNICAL FIELD

The present invention is related to semiconductor manufacturing processes, in particular, using a resist asher to form a dopant species into a substrate.

BACKGROUND ART

The fabrication of integrated circuits includes numerous processes. Ion implantation is one such process commonly used in the manufacture of integrated circuits wherein dopant ions are selectively implanted, for example, through an organic photoresist mask into the surface of a semiconductor substrate or wafer. The photoresist mask is typically cast from a solvent and developed into a patterned mask using a photolithography process and may be used as a patterned mask during an ion implantation process. During an ion implantation process, the dopant ions or implant species react with the surface of the photoresist mask, and are implanted into the semiconductor substrate through the openings in the photoresist mask.

The implant species also becomes embedded in the patterned photoresist material during the ion implantation. Implant species (containing dopant ions) may include, but are not limited to, elements such as arsenic, phosphorus, and boron. When the implant process has been completed, the photoresist mask is typically removed or stripped using either a conventional wet or dry stripping process. One form of dry stripping is commonly referred to as ashing, and in a typical ashing process, a wafer is placed into an oxygen plasma asher to break through the implant species (dopant) crusted portion of the photoresist layer and remove the patterned photoresist mask. Plasma asher devices include downstream plasma ashers, microwave plasma ashers, or inductively coupled plasma reactors or chambers.

An oxygen plasma asher may contain a variety of reactive gases, or forming gases, such as oxygen, hydrogen, nitrogen, or fluorine. The reactive gases in the plasma chamber remove the photoresist material and implant species by forming volatile reaction products and/or by weakening the adhesion of the photoresist to the substrate or wafer. The dopant ions or implant species will react with the reactive gases, for example, hydrazine ($N_2H_2$), that are fed into the asher.

Typically, a ratio of oxygen to $N_2H_2$ is 6.6 to 1 using an oxygen flow rate of 2,000 sccm (standard cubic centimeters per minute) and an $N_2H_2$ flow rate of 300 sccm. In a typical resist ash recipe, it is desirable to increase the resist ash rate. It has been shown, for example in Fujimura et al. "Additive Nitrogen Effects On Oxygen Plasma Downstream Ashing" (Japanese Journal of Applied Physics, Vol. 29, No. 10, October 1990, pp 2165-2170), that additional nitrogen in oxygen plasma could increase a resist ash rate. In U.S. Pat. No. 6,524,936 by Hallock et al., in an ashing process, the photoresist mask is exposed to ultra-violet light, allowing increased temperatures used during an ashing process, resulting in faster throughputs.

The stripping process normally continues until the photoresist has been removed or the photoresist residues are rendered removable by a wash or rinse step. While it is desirable to increase the asher rate, the formation of compounds with reactive gases must also be increased. It is also desirable to minimize implant species (dopant) deposits in the plasma asher chamber. Reactive gases and implant species form volatile compounds that are pumped away or out of the plasma asher chamber by the asher chamber vacuum system. Numerous articles, for example, "Chamber Contamination in Ashing Processes of Ion Implanted Photoresist" by Laurent Kassel and Jeff Perry (S.P.I.E., Vol. 1803 (1992)/89, 0-8194-1001-2/93) discuss a variety of methods to reduce or prevent the accumulation of an implant species in a resist asher chamber.

SUMMARY

A method for forming a dopant in a substrate by accumulating or transporting at least one dopant species onto an interior of an asher chamber and forming the accumulated dopant species on an exposed portion of the substrate. A plasma is developed in the asher and one or more dopant species are formed into exposed areas of the substrate and driven into the substrate. A threshold voltage or an electrical device is measured on the substrate to verify or confirm that a proper dopant level has been achieved. An advantage of the present invention is the reduction of processing steps in manufacturing a wafer or integrated circuit.

BRIEF DESCRIPTION OF THE DRAWINGS

FIG. 1B is a chart showing (different) dopant species concentration depth profiles into a surface of silicon substrate from a plasma asher chamber part with no accumulated dopant.

FIG. 4 is a chart showing threshold voltage measurements of devices formed without dopants on a wafer, compared to voltage threshold devices formed with dopants accumulated or transported onto the interior of an asher chamber.

DETAILED DESCRIPTION

Figure 1:
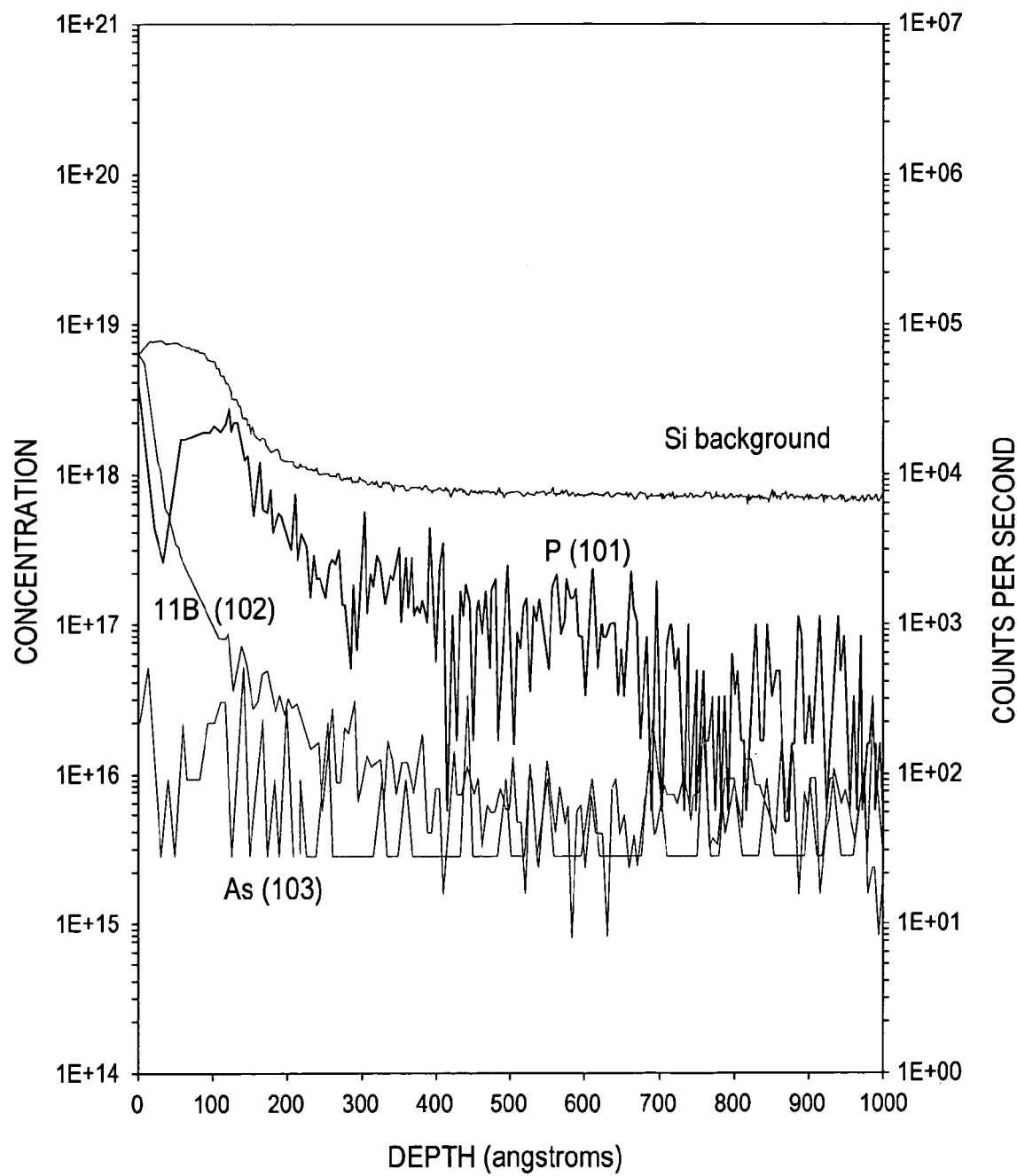
FIG. 1 is a chart showing (different) dopant species concentration depth profiles into a surface of silicon substrate from a plasma asher chamber part.

Typically, in an ashing process, a dopant species in the resist mask will react with a forming gas, for example $N_2H_2$, that is fed into the asher to form volatile compounds that are pumped away by an asher chamber vacuum system. Compounds formed during the ashing process should have a reasonable vapor pressure in order to be pumped away.

However, a dopant species may also be accumulated or transported on the interior of the asher chamber. For example, when an aluminum surface is exposed to fluorine (radicals) from a fluorine based plasma, the atoms absorb and react to form aluminum fluoride ($AlF_3$) as an etch byproduct. The etch byproduct generally requires a reasonable vapor pressure in order to stimulate the desorption reactions. The desorption reactions cause etching to take place. However, the vapor pressure of $AlF_3$ is approximately 1 Torr, at 1,240° C., therefore etching mechanisms do not occur at ambient temperatures. For example, in a $PH_3$ etch byproduct case, (phosphorous from the chamber and hydrogen from a forming gas), the $PH_3$ exists in solid formation from 1 Torr to 10 Torr, which is not a vapor form to be pumped away. Information regarding the gaseous/liquid/solid state of various compounds may be found in compilation tables of inorganic compounds by Daniel R. Stull in "Industrial and Engineering Chemistry" referring to Handbook of Chemistry and Physics, 63$^{rd}$ Edition, CRC Press, page D-199 ISBN 0-8493-0463-6 and from "Introduction to Microlithography" in chapter 5 of Plasma Etching, page 224, ISBN 0-8412-00775-5.

Over time, a deposited dopant species may accumulate in an asher and become a dopant source that may be formed into a substrate surface. The substrate is frequently a silicon wafer. In this embodiment, the specific silicon wafer is doped as a p-type substrate. Alternatively, another elemental group IV semiconductor or compound semiconductor (e.g., group III-V) may be selected for the substrate. When a plasma is formed in the asher chamber, species transported onto the interior of an asher are extracted into the plasma and may be formed into a substrate surface. Normally, hydrogen from an oxygen-diazine ($O_2/N_2H_2$) plasma reacts with a resist embedded phosphorus forming phosphorus hydride ($PH_3$) whose vapor pressure is 40 torr at −130° C.

In the described invention, an asher process to increase the transportation of a dopant species onto the interior of the asher chamber is implemented. Generally, to increase the accumulation of a phosphorus dopant species, a reduction in the amount of forming gas and/or a reduction in pressure is used. For example, phosphorus hydride exists in a solid form at 1 torr which is more difficult to pump from the asher chamber. Also, using less forming gas (e.g., nitrogen, or hydrogen) in the ashing process increases the likely-hood of an increased transportation of a dopant species onto the asher chamber interior. In one embodiment or process recipe, a ratio of oxygen to $N_2H_2$ is 5.6 to 1 using an oxygen flow rate of 1,700 sccm, a $N_2H_2$ flow rate of 300 sccm, a pressure of 1.5 torr, a temperature of 240° C., and a microwave power of 1500 watts. In an alternate embodiment, an oxygen flow rate of 1,700 sccm, an $N_2H_2$ flow rate of 50 sccm, and a Nitrogen flow rate of 250 sccm is used.

Over time, the interior of the asher chamber will accumulate dopant species. Referring to FIG. 1, an exemplary portion of a substrate has been tested, and surface concentrations or the residual depth for a variety of dopant species have been measured. In particular, substrates having photoresist material exposed to phosphorus (P) 101 and boron (B) 102 and arsenic (As) 103 have been ashed in the particular chamber. The chemical analysis result from this particular chamber is shown in Table 1.

FIG. 1B shows substrates having photoresist material that have been ashed in an asher chamber containing no accumulated dopant species.

Generally, an adequate amount of a dopant species must be transported onto in the asher chamber interior to affect the threshold voltage of a device, for example, to adequately develop an MOS transistor. A general approach to determine a desired concentration of a dopant species in an asher chamber may be determined by occasionally running at least one test substrate and testing a threshold voltage of a device on the test substrate.

Resist films may contain a combination of dopant species. However, a specific asher chamber will generally be chosen and isolated to perform ashing processes for a single specific dopant species. For example, a first asher chamber is used to remove only patterned resist films that have been exposed to a phosphorus species while a second asher is used to remove only patterned resist films that have been exposed to an arsenic species.

Generally, after an approximate period of time, number of wafers processed, or having a threshold concentration level of a dopant species accumulated in an asher chamber, concentration levels sufficient to effect a device threshold voltage on a processed wafer or substrate will be attained. An asher chamber may then be used to develop a plasma to carry the dopant species and sufficiently form a dopant on a substrate. The asher may be used to reduce the number of process steps in comparison to, for example, an implant process.

Through the above testing, a general concentration of an implant species or dopant source deposited on the interior surface of an asher chamber should be above approximately 1E17 atoms/cm$^3$ for a phosphorus species and approximately above 1E16 atoms/cm$^3$ for arsenic species to affect the nominal threshold voltage of a device on a substrate. Over time, an exemplary asher chamber will accumulate a quantity of a dopant species to affect the threshold voltage of the device for either phosphorous or for arsenic. In general, to accumulate a desired concentration of a dopant species in an asher chamber, ashing approximately 500,000 wafers, or running ashing processes for approximately one year or more without removing the parts of ash interior may be required.

The plasma asher is measured or tested to identify when an acceptable concentration level of a particular dopant species exists. A portion of the asher chamber may be tested or measured, for example, including but not limited to testing the surface concentration of, the plasma tube, baffle plate, and lower heater window. Testing may be limited to the baffle plate and lower heater window based on their physical proximity to substrates being processed. The parts of an asher chamber are submitted to a non-destructive test and the parts are then reinstalled into the asher chamber. An optional cleaning operation, for example using a hydrofluoric chemical cleaning process, may be performed before reinstallation. Table 1 below, lists exemplary test results (surface concentrations and volumetric concentrations) for sample plasma tubes, baffle plates, and lower heater windows containing various dopant species: arsenic (As), boron (B), and phosphorus (P). Normally, parts having significant surface areas or those having deposited dopant species are reinstalled in the asher chamber. An "*" indicates the concentration is below a measurable or detection limit.

TABLE 1

CONCENTRATION OF IMPLANT SPECIES IN ASHER PARTS

| Chamber Part | Dopant Species | Concentration atoms/cm$^2$ | Concentration atoms/cm$^3$ |
|---|---|---|---|
| Plasma Tube | Antimony (Sb) | 5E+10 | * |
| Plasma Tube | Arsenic (As) | 9E+11 | 1E+13 |
| Plasma Tube | Boron (B) | 2E+13 | 5E+14 |
| Plasma Tube | Phosphorus (P) | 1E+16 | * |
| Baffle Plate | Antimony (Sb) | 4E+10 | * |
| Baffle Plate | Arsenic (As) | 6E+11 | 1.2E+16 |
| Baffle Plate | Boron (B) | 1E+13 | 1.7E+17 |
| Baffle Plate | Phosphorus (P) | 7E+14 | 1.7E+17 |
| Lower Heater Window | Antimony (Sb) | 4E+10 | 4E+10 |
| Lower Heater Window | Arsenic (As) | 7E+11 | 1.2E+16 |
| Lower Heater Window | Boron (B) | 2E+13 | 9.5E+16 |
| Lower Heater Window | Phosphorus (P) | 9E+14 | 1.3E+17 |

After an asher chamber has accumulated an adequate amount of a dopant species, the chamber may be used to form and/or diffuse the dopant species or dopant into a substrate or wafer. In semiconductor processing, device structures are generally formed using photoresist masking processes. For example, in MOS device processing a drain or source area may be formed by selectively forming a dopant onto the substrate surface and then driving the deposited dopant into the substrate.

Figure 2A:
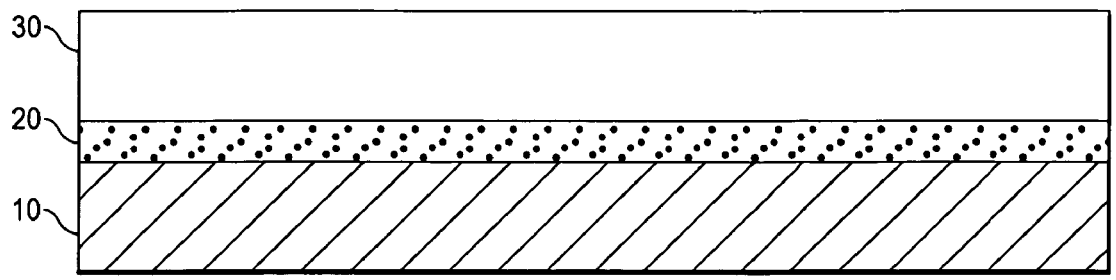
FIG. 2A is a cross section of a substrate with an oxide layer and a photoresist layer formed above the substrate.
Figure 2B:
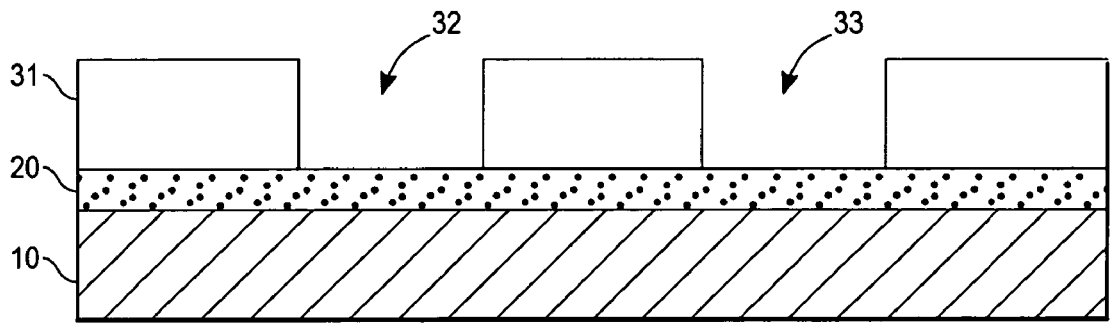
FIG. 2B is the cross section of FIG. 2A after the photoresist layer has been patterned to form a mask.
Figure 2C:
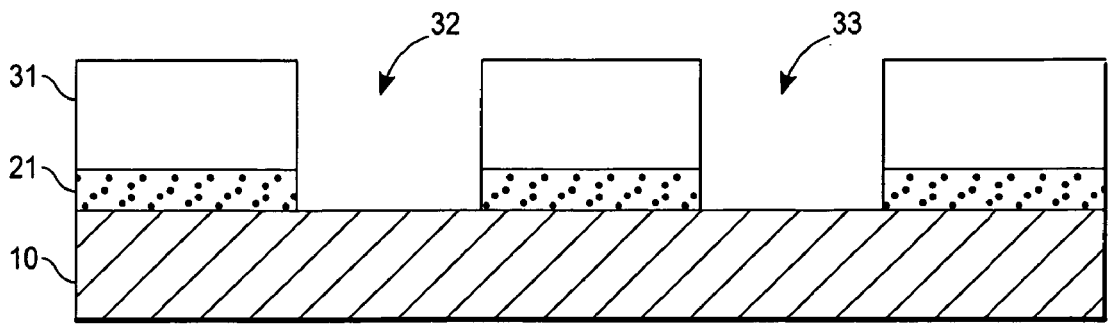
FIG. 2C is the cross section of FIG. 2B after a portion of the oxide layer has been removed.

FIGS. 2A-C represent exemplary processing steps performed outside of the asher chamber. Referring to FIG. 2A, a beginning substrate is used. The substrate may be the unprocessed surface of a wafer, or a wafer that has been previously processed that contains formed semiconductor features. An oxide layer 20 is formed over a substrate 10. For example, for a silicon wafer, heating the wafer to high temperatures and exposure to oxygen or water vapor forms a silicon dioxide layer over the surface of the wafer. Next, a photoresist layer 30 is formed over the oxide layer 20. Photoresists are generally organic photosensitive films used to transfer images to an underlying substrate and are typically applied to the substrate as a liquid coating for example, by spinning, dipping, or roller coating.

Referring to FIG. 2B, the photoresist layer 30 is then patterned using a variety of techniques, such as a selective photolithographic exposure through a mask, electron beam exposure, or other similar processes. Generally, the exposure is sufficient to effectively activate a photoactive component in the photoresist layer to produce a change in the dissolution properties between the exposed and unexposed areas. The photoresist layer is then developed and washed to obtain a patterned photoresist mask 31 having exemplary openings 32, 33. Next, referring to FIG. 2C, a portion of the oxide layer 20 is selectively removed in the patterned photoresist trench areas, for example by using an anisotropic plasma etching, reactive ion etching, or an isotropic etch process such as a wet etch.

Figure 3A:
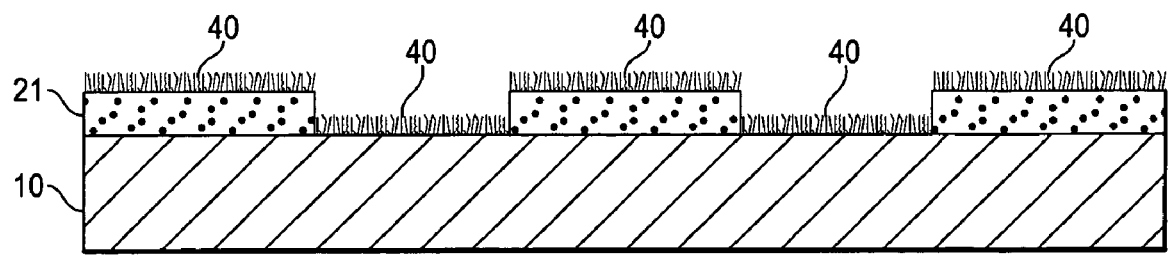
FIG. 3A is a cross section of FIG. 2C after the patterned photoresist mask has been removed.
Figure 3B:
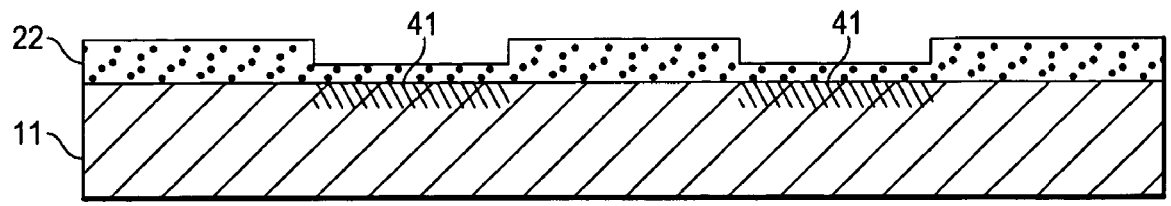
FIG. 3B is a cross section of FIG. 3A after a dopant has been diffused into the underlying substrate.

FIGS. 3A and 3B represent exemplary processing steps performed inside an asher chamber. A variety of techniques to selectively mask the wafer may be used. The prior processing steps include using a patterned oxide 21 layer as a mask. However, alternate process steps to develop a mask may also be used. After selected portions of the oxide have been removed, the patterned photoresist 31 (not shown in FIG. 3A or 3B) is removed using a plasma ashing process. With selected areas of the substrate surface exposed, the substrate is heated to simultaneously remove the patterned photoresist 31 and form at least one dopant species 40 over the surface of the substrate. As long as the substrate is exposed, for example on the source or drain region of a device, the dopant species transported to and accumulated on the interior of the asher may then be formed on the substrate 10.

A variety of asher recipes (for example, variations in temperature on time) may be used to remove the patterned photoresist 31 as long as a plasma is developed in the asher chamber to carry the accumulated dopant species from the interior chamber surface to the wafer or substrate. Diffusion, for example of arsenic, boron, or phosphorus, will take place in the exposed or unprotected regions of the substrate 10 surface. No significant dopant penetration will occur in the regions covered by the patterned oxide 21.

Referring to FIG. 3A, a dopant 40 has been formed on the exposed portion of the silicon substrate 10 while the patterned photoresist 31 has simultaneously been degraded or removed by the asher process. In one embodiment, as the process continues, the dopant species or dopant 40 sources diffuse into the substrate 10 and an oxide layer 21 forms above the surface of the substrate 10. In an alternate embodiment, a dopant species may be driven into a substrate, for example using a different thermal process or profile. Referring to FIG. 3B, the dopant species or dopant 40 has been diffused into the substrate to form a doped area 41 and an oxide layer 22 has been formed above the substrate.

After the asher/dopant process has been completed, the wafers or substrates are tested to verify that the asher/dopant process has been successful in changing the threshold voltage characteristics of a device being formed. The threshold voltage ($V_t$) for a MOS device may be defined as the voltage applied to the gate that is necessary to open a conductive channel between the device source and drain, or the voltage necessary for an inversion layer to be formed at the semiconductor surface.

With reference to FIG. 4, threshold voltage ($V_t$) measurements for PMOS type devices formed on wafers processed in an asher without accumulated dopant species is compared with PMOS type devices formed on wafers processed in an asher containing accumulated dopant species. In this case, a PMOS device is rejected if the threshold voltage is below −900 mV. However, the exemplary information provided in FIG. 4 illustrates that the threshold voltage of a device may be affected by an asher chamber containing an accumulated dopant species. Each data point represents an average threshold voltage for devices measured on a single wafer. The wafers tested in the first wafer batch 410 have been processed in an asher chamber containing no accumulated dopant species, and have an average threshold voltage of approximately −900 mV. A second tested wafer batch 420, having been processed in an asher chamber having an accumulation of dopant species, contains devices having different average threshold voltage, indicating that a dopant species has been deposited and diffused into the selectively exposed areas of those wafers or substrates. More negative threshold voltage in PMOS indicates that majority concentration of n-type substrate has been increased by additional dopants from an asher chamber containing phosphous or arsenic species. Measurements taken at unexposed areas on both wafer batches 430 indicate a uniform measurement, eliminating other process variations as having an affect on the threshold voltage measurements.

These tests indicate that an asher may be used to deposit a dopant in a substrate to change a device threshold voltage. Thus, a resist asher may be used to reduce the cost of manufacturing a wafer or integrated circuit by reducing the number of steps in a process.

Those of skill in the art will recognize that the invention can be practiced with modification and alteration within the spirit and scope of the appended claims and many other embodiments will be apparent to those of skill in the art upon reading and understanding the above description. For example, other substrate materials, implant species, and other photoresist materials will be apparent to those skilled in the art in view of this disclosure. Photoresist materials used may be positive acting or negative acting depending on the chosen photoresist chemistries and developers. The description is thus to be regarded as illustrative instead of limiting.

What is claimed is:

1. A method for forming a dopant in a substrate undergoing processing, the method comprising:

transporting a dopant species onto an interior of an asher chamber by ashing dopant containing resist films from a plurality of processed substrates, using less forming gas when transporting said dopant species onto said interior of an asher chamber in comparison to a process designed to remove said dopant species from said asher chamber;

forming said dopant species into exposed areas of a substrate undergoing processing; and driving said dopant species into said substrate undergoing processing.

2. The method of claim 1 wherein said dopant species is carried from said interior of said asher chamber by a plasma into said exposed areas of said substrate undergoing processing.

3. The method of claim 1 further comprising using a lower pressure when transporting said dopant species onto said interior of an asher chamber in comparison to a process designed to remove said dopant species from said asher chamber.

4. The method of claim 1 further comprising measuring a surface concentration of said dopant species from said substrate processed in said interior of said asher chamber.

5. The method of claim 4 further comprising measuring said surface concentration of said dopant species on a plasma tube, on a baffle plate, or on a heater window.

6. The method of claim 5 further comprising removing said plasma tube, said baffle plate, or said heater window from said asher chamber to measure said surface concentration of said dopant species and reinstalling said plasma tube, said baffle plate, or said heater window into said asher chamber.

7. The method of claim 1 further comprising determining an approximate surface concentration for said dopant species transported onto said interior of said asher chamber.

8. The method of claim 1 further comprising forming a patterned oxide over said substrate undergoing processing prior to forming said dopant species into exposed areas of said substrate undergoing processing.

9. The method of claim 1 further comprising measuring a threshold voltage of an electrical device produced on said substrate undergoing processing.

10. The method of claim 1 further comprising measuring a surface concentration of said dopant species from said substrate undergoing processing in said asher chamber.

11. A method for forming a dopant in a substrate undergoing processing, the method comprising:
  transporting a dopant species onto an interior of an asher chamber by ashing dopant containing resist films from a plurality of processed substrates, using a lower pressure when transporting said dopant species onto said interior of an asher chamber in comparison to a process designed to remove said dopant species from said asher chamber;
  forming said dopant species into exposed areas of a substrate undergoing processing; and
  driving said dopant species into said substrate undergoing processing.

12. The method of claim 11 wherein said dopant species is carried from said interior of said asher chamber by a plasma into said exposed areas of said substrate undergoing processing.

13. The method of claim 11 further comprising using less forming gas when transporting said dopant species onto said interior of an asher chamber in comparison to a process designed to remove said dopant species from said asher chamber.

14. The method of claim 11 further comprising measuring a surface concentration of said dopant species from said interior of said asher chamber.

15. The method of claim 14 further comprising measuring said surface concentration of said dopant species on a plasma tube, on a baffle plate, or on a heater window.

16. The method of claim 15 further comprising removing said plasma tube, said baffle plate, or said heater window from said asher chamber to measure said surface concentration of said dopant species and reinstalling said plasma tube, said baffle plate, or said heater window into said asher chamber.

17. The method of claim 11 further comprising determining an approximate surface concentration for said dopant species transported onto said interior of said asher chamber.

18. The method of claim 11 further comprising forming a patterned oxide over said substrate undergoing processing prior to forming said dopant species into exposed areas of said substrate undergoing processing.

19. The method of claim 11 further comprising measuring a threshold voltage of an electrical device produced on said substrate undergoing processing.

20. The method of claim 11 further comprising measuring a surface concentration of said dopant species from said substrate undergoing processing in said asher chamber.

21. A method for forming a dopant in a substrate undergoing processing, the method comprising:
  transporting a dopant species onto an interior of a plasma chamber by ashing dopant containing resist films from a plurality of processed substrates;
  forming a patterned oxide over a substrate undergoing processing;
  generating a plasma in said plasma chamber, said plasma being used to carry said dopant species to said exposed areas of said substrate undergoing processing;
  forming said dopant species within exposed areas of said substrate undergoing processing; and
  driving said dopant species into said substrate undergoing processing.

22. The method of claim 21 further comprising using less forming gas, when transporting said dopant species onto said interior of said plasma chamber, in comparison to a process designed to remove said dopant species from said interior of said plasma chamber.

23. The method of claim 21 further comprising using a lower pressure when transporting said dopant species onto said interior of said plasma chamber, in comparison to a process designed to remove said dopant species from said interior of said plasma chamber.

24. The method of claim 21 further comprising measuring a surface concentration of said dopant species from an interior part of said plasma chamber.

25. The method of claim 22 further comprising measuring said surface concentration of said dopant species in a plasma tube, in a baffle plate, or in a heater window of said plasma chamber.

26. The method of claim 22 further comprising removing said plasma tube, said baffle plate, or said heater window from said plasma chamber to measure said surface concentration of said dopant species and reinstalling said plasma tube, said baffle plate, or said heater window into said plasma chamber.

27. The method of claim 21 further comprising determining an approximate surface concentration for said dopant species transported onto an interior part of said plasma chamber.

28. The method of claim 21 further comprising measuring a threshold voltage of an electrical device produced on said substrate undergoing processing.

29. The method of claim 21 further comprising measuring a surface concentration of said dopant species from said substrate undergoing processing in said asher chamber.

* * * * *